United States Patent [19]
Sinar et al.

[11] Patent Number: 5,070,383
[45] Date of Patent: Dec. 3, 1991

[54] PROGRAMMABLE MEMORY MATRIX EMPLOYING VOLTAGE-VARIABLE RESISTORS

[75] Inventors: Alexander B. Sinar, Cupertino; Levy Gerzberg, Palo Alto, both of Calif.; Yosef Y. Shacham, Haifa, Israel; Ilan A. Blech, Sunnyvale; Eric R. Sirkin, Palo Alto, both of Calif.

[73] Assignee: Zoran Corporation, Santa Clara, Calif.

[21] Appl. No.: 295,274

[22] Filed: Jan. 10, 1989

[51] Int. Cl.$^5$ .................. H01L 27/02; H01L 27/10; H01L 45/00; G11C 17/06
[52] U.S. Cl. .................................. 357/51; 357/45; 357/2; 365/105
[58] Field of Search ..................... 357/51, 45, 2

[56] References Cited
U.S. PATENT DOCUMENTS

| 4,210,996 | 7/1980 | Amemiya et al. | 357/59 |
| 4,238,694 | 12/1980 | Kimerling et al. | 357/29 |
| 4,432,008 | 2/1984 | Maltiel | 357/51 |
| 4,442,507 | 4/1984 | Roesner | 357/59 |
| 4,569,120 | 2/1986 | Stacey et al. | 357/45 |

Primary Examiner—Rolf Hille
Assistant Examiner—Robert P. Limanek
Attorney, Agent, or Firm—Henry K. Woodward

[57] ABSTRACT

A memory matrix comprises a plurality of word lines, a plurality of bit lines, and a stacked diode and voltage-variable resistor structure interconnecting bit lines to word lines. The stacked diode and voltage-variable resistor structure includes a doped region in a semiconductor substrate defining a work line, a doped polycrystalline silicon layer over said word line and forming a p-n junction therewith, and an amorphized region in the doped polycrystalline silicon layer having increased resistance over the non-amorphized portion of the doped polycrystalline silicon layer. A contact is made to the amorphized polycrystalline silicon material which preferably includes a titanium-tungsten barrier layer and an aluminum layer over the barrier layer. To improve the breakdown voltage of the diode structure, a region of opposite conductivity type is formed in the word line under the doped polycrystalline silicon layer either by out-diffusion of dopants from the polycrystalline silicon layer or by the implantation of dopant ions through the polycrystalline silicon layer into the word line.

6 Claims, 2 Drawing Sheets

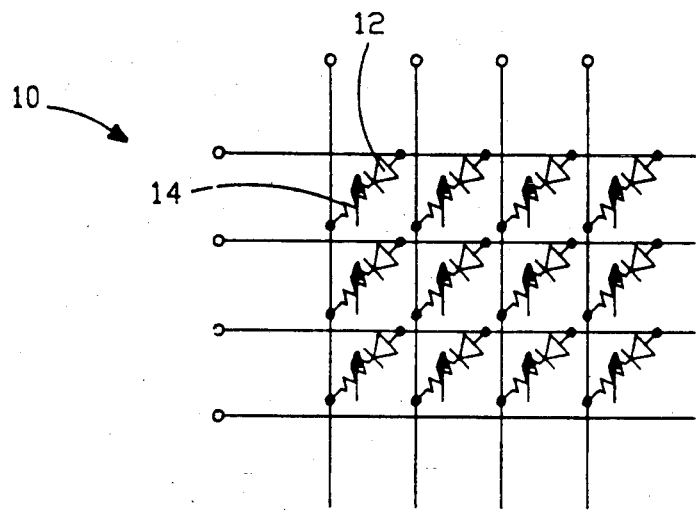
FIG.—1
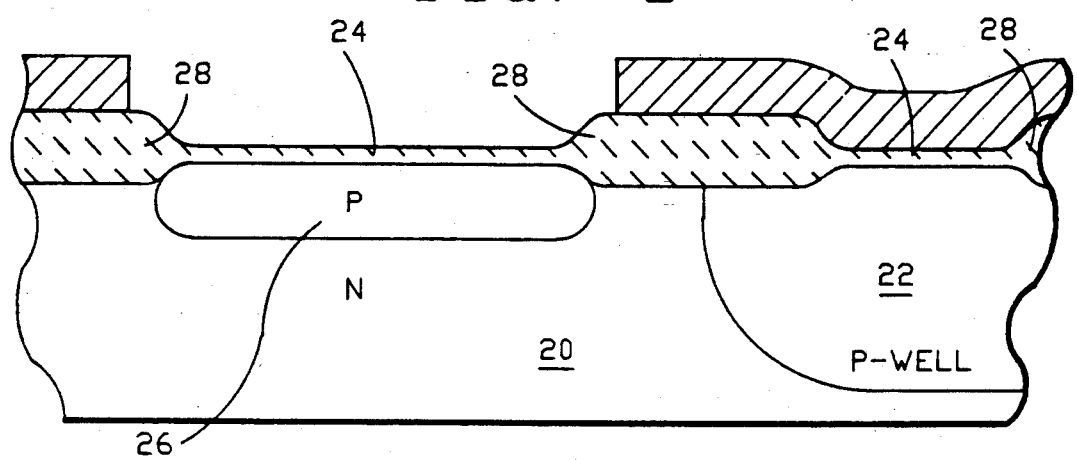
FIG.—2A
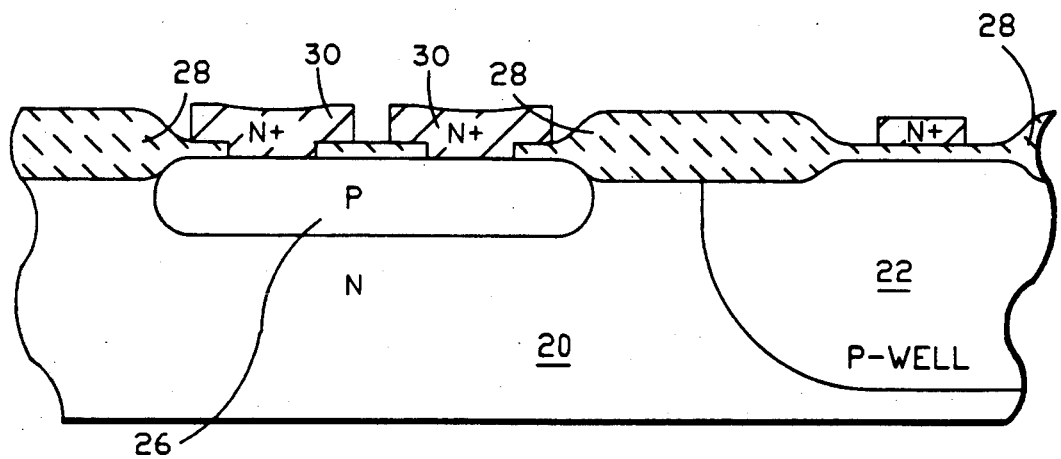
FIG.—2B

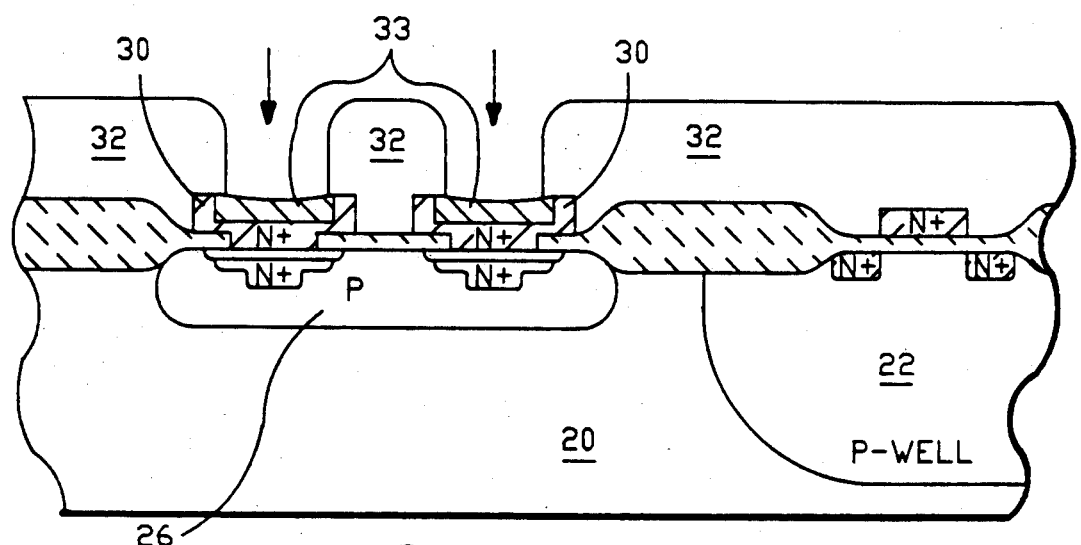
FIG.—2C
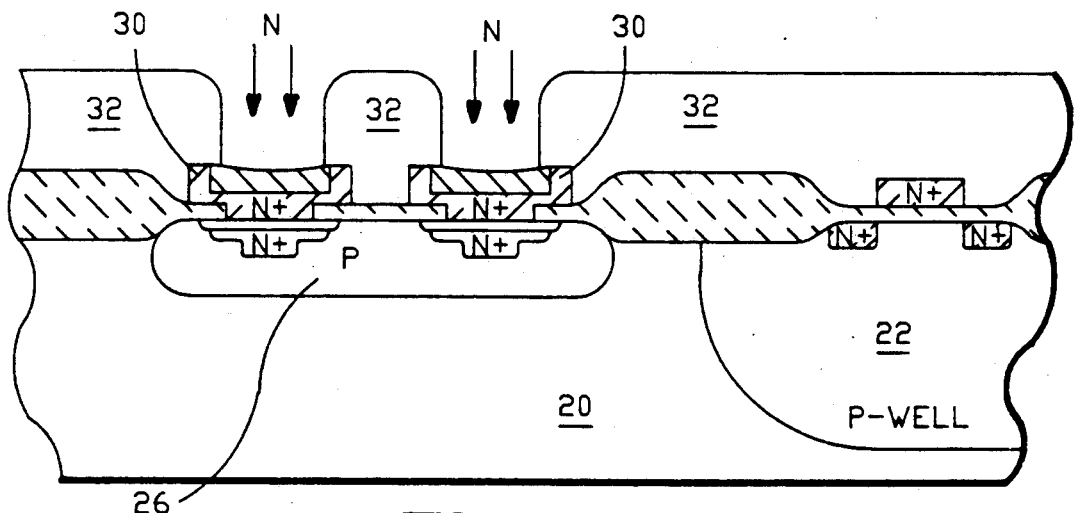
FIG.—2D
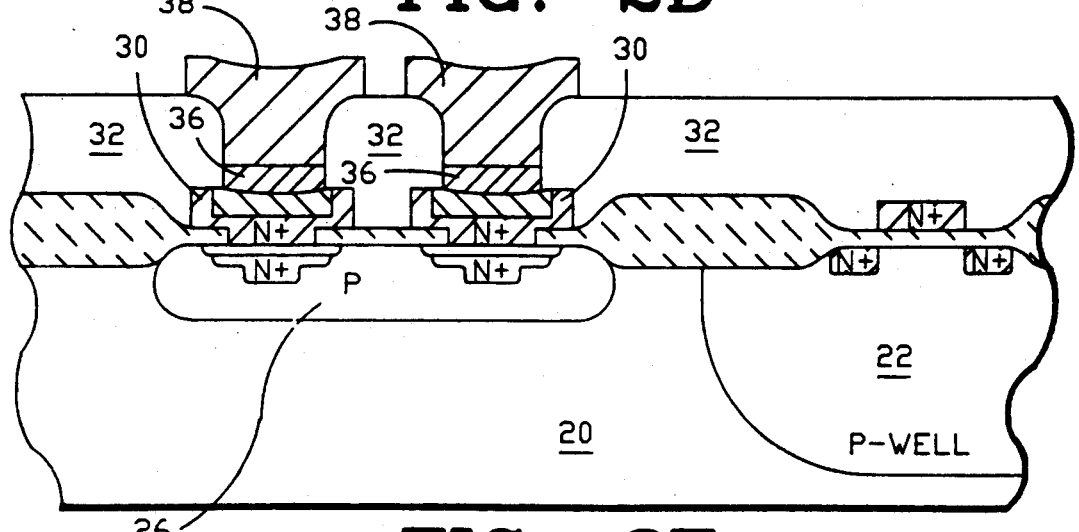
FIG.—2E 5,070,383

PROGRAMMABLE MEMORY MATRIX EMPLOYING VOLTAGE-VARIABLE RESISTORS

BACKGROUND OF THE INVENTION

This application is related to copending application Ser. No. 451,823, filed Dec. 21, 1982, for METHOD AND STRUCTURE FOR SELECTIVELY INTERCONNECTING ELECTRICAL CIRCUIT ELEMENTS by Levy Gerzberg, coapplicant herein, and to copending application Ser. No. 245,115, filed Sept. 15, 1988, now U.S. Pat. No. 4,845,045 for METHOD OF FABRICATING ELECTRICALLY PROGRAMMABLE ELEMENT IN A SEMICONDUCTOR INTEGRATED CIRCUIT by Alex Sinar, Eric Sirkin, Elan Blech, Yosef Shacham and Levy Gerzberg.

This invention relates generally to programmable memory matrices and more particularly the invention relates to a programmable memory matrix employing voltage-variable resistors as the programming elements.

Copending application Ser. No. 451,823, supra, discloses a voltage-variable resistor which uses predictable and selectable programming voltages. A surface region of a semiconductor body is bombarded with ions to disrupt the crystalline structure of the surface region or to implant dopant ions which are not initially activated in the crystalline structure. This greatly increases the resistance of the surface region. Subsequently, by impressing sufficient voltage across the surface region, part of the amorphized surface of the structure is annealed and the ions are activated, thereby significantly reducing the resistance of the surface region. The application discloses the use of the voltage-variable resistors in a diode matrix with each diode in the matrix being serially connected with a voltage-variable resistor for programming the matrix.

The present invention is directed to a diode matrix memory of the type disclosed in application Ser. No. 451,823, supra.

SUMMARY OF THE INVENTION

An object of the present invention is an improved memory matrix employing voltage-variable resistors.

Another object of the invention is a method of fabricating a programmable memory matrix employing voltage-variable resistors which is compatible with standard CMOS fabrication techniques.

Yet another object of the invention is an improved voltage-variable resistor and method of making same.

Briefly, in accordance with the invention, a diode structure is formed in a doped region of a semiconductor body and the surface of the region is then amorphized by bombardment with ions to increase the resistance thereof. In effect, the bombarded surface is a resistor in series with the diode formed in the region of the semiconductor body. The diode is connected to a word line in the semiconductor body, and a bit contact is made to the amorphized region. During normal operation, the operating voltage (e.g. +5 volts) does not affect the high-resistance state of the amorphized region. However, when a programmable voltage, typically in the range of 7-25 volts, is impressed across the bit contact and the word line, the amorphized region is partially annealed and the dopant atoms are partially activated, thereby reducing the resistance.

More particularly, in a preferred embodiment, the word line is a doped region in a monocrystalline semiconductor substrate, and a polycrystalline material is formed over a portion of the word line. The polycrystalline material is oppositely doped and forms a p-n junction or diode with the word line. The surface of the polycrystalline material is then amorphized to form the resistive element. To improve the breakdown voltage of the doped polycrystalline material and the oppositely-doped monocrystalline word line, additional dopant is implanted through the contact opening on the polycrystalline material and into the underlying monocrystalline material before the contact structure is formed. This step is similar to the process disclosed in copending application Ser. No. 245,115, supra.

In forming the contact to the amorphized region, preferably a barrier metal layer such as titanium-tungsten is applied to the surface of the amorphized region, and then a layer of aluminum is formed on the barrier metal to complete the contact.

The invention and objects and features thereof will be more fully understood from the following detailed description and appended claims when taken with the drawing.

BRIEF DESCRIPTION OF THE DRAWING

FIG. 1 is a schematic of a portion of a memory array employing a plurality of serially-connected diodes and voltage-variable resistors in accordance with the invention.

FIGS. 2A-2E are section views of a portion of a semiconductor assembly during fabrication of serially-connected resistors and diodes in a conventional CMOS process flow in accordance with the invention.

DETAILED DESCRIPTION OF ILLUSTRATIVE EMBODIMENTS

FIG. 1 is a schematic of a portion of a memory array 10 employing serially-connected diodes 12 and voltage-variable resistors 14 connected between bit lines and word lines in accordance with the invention and as illustrated in copending application Ser. No. 451,823, supra. This schematic of a memory array represents an improvement over other memory arrays using voltage-variable resistors and serially-connected access transistors, which limit the size reduction of the array assembly. In the illustrated embodiment the access transistor is replaced by a diode stacked under each voltage-variable resistor device FIGS. 2A-2E are section views of a portion of a semiconductor structure of FIG. 1 illustrating the fabrication of the stacked diode and variable resistor devices in a conventional CMOS process flow. In FIG. 2A an n-type substrate 20 is provided and a p-well 22 is formed therein for the n-channel transistors. After the gate oxide 24 is grown over the p-well, rows of p+ diffusions 26 are defined by way of an implant mask of moderate dose ($10^{15}$ sq.cm) which function as word lines.

Referring to FIG. 2B, polycrystalline silicon 30 is deposited and doped either during deposition or by post-deposition as n+ material. Some of the n+ dopant from the polycrystalline layers 30 out-diffuses into the surface of the word line 26, as shown.

In accordance with one feature of the invention, the n+ region in the word line 26 is deepened by the implantation of n dopants as shown in FIG. 2C, thereby forming plugs in the word line 26 beneath the polycrystalline layers 30 through openings in a low-temperature oxide 32. This is similar to the process described in copending application Ser. No. 245,115.

Thereafter, as illustrated in FIG. 2D, the exposed surface 33 of the polycrystalline material 30 through the low-temperature oxide 32 is bombarded by argon ions or other ions to disrupt the crystalline structure in the surface region of the polycrystalline layers 30 and thereby increase the resistance thereof. Other ions such as silicon dopants (i.e. phosphorus, arsenic) or neutral (i.e. silicon) can be employed to increase the resistance of the polycrystalline material by ion bombardment. For a 1.2 micron technology, an argon implant of $1.0 \times 10^{16}$ 40 KeV followed by exposure to an oxygen plasma results in an initial resistance of 20M$\Omega$ to 200M$\Omega$ with a programming voltage of 7-9 volts.

Thereafter, as illustrated in FIG. 2E, a thin layer of a barrier metal such as titanium-tungsten 36 is formed on the surface of the polycrystalline material and then aluminum contacts 38 are formed over the barrier layer 36 to form the bit lines of the memory array.

The device is programmed by positive voltage applied to the p+ word lines 26 and a low voltage applied to the contact 38. A READ operation is performed by applying low voltage to the bit lines 38 and a high voltage to the selected word line 26. The breakdown voltage of the series diode is well above the operating voltage of 5.5 volts required for a READ operation.

A stacked diode and voltage-variable resistor in accordance with the invention is compact in structure and is reproducible in breakdown voltage. The use of a plug in the diode structure improves the breakdown voltage of the n+ polysilicon material to the p+ single-crystal silicon material which forms the diode. As described above, the process is compatible with a conventional CMOS process flow.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

We claim:

1. A programmable memory array comprising
a monocrystalline semiconductor substrate,
a plurality of word lines formed in said substrate by dopants of a first conductivity type, and
a plurality of stacked diode and voltage-variable resistor structures on each word line with a bit contact to each stacked diode and voltage-variable resistor,
each diode comprising a doped polycrystalline layer of opposite conductivity type in contact with a word line and an ion-implanted region of opposite conductivity type in said word line thereby forming a p-n junction with said word line, and each voltage-variable resistor comprising an amorphized surface region in said polysilicon layer.

2. The programmable memory array as defined by claim 1 wherein each bit contact comprises a metal contact to said amorphized surface region.

3. The programmable memory array as defined by claim 2 wherein said metal contact comprises a barrier metal layer on said amorphized surface region and a second metal layer on said barrier metal layer.

4. A stacked diode and voltage-variable resistor structure comprising
a semiconductor substrate having a doped surface region of one conductivity type,
a layer of doped polycrystalline silicon on said doped surface region, said doped polycrystalline silicon being of opposite conductivity type,
an ion-implanted region of opposite conductivity type in said doped surface region underlying said doped polycrystalline silicon and forming a p-n junction with said doped surface region,
an amorphized region in said doped polycrystalline silicon layer having higher resistance than the non-amorphized doped polycrystalline silicon layer, and
a contact on said amorphized portion of said doped polycrystalline silicon layer.

5. The stacked diode and voltage-variable resistor structure as defined by claim 4 wherein said contact comprises a barrier metal layer on said amorphized region of said polycrystalline silicon layer and a layer of a second metal on said barrier metal layer.

6. The stacked diode and voltage-variable resistor structure as defined by claim 5 wherein said barrier metal comprises titanium-tungsten and said second metal comprises aluminum.

* * * * *